United States Patent [19]
Bhuva et al.

[11] Patent Number: 5,648,730
[45] Date of Patent: Jul. 15, 1997

[54] LARGE INTEGRATED CIRCUIT WITH MODULAR PROBE STRUCTURES

[75] Inventors: Rohit L. Bhuva, Plano; Bao Tran, Richardson; James L. Conner, Rowlett; Michael Overlaur, Plano; Tracy S. Paulsen, Rowlett, all of Tex.

[73] Assignee: Texas Instruments Incorporated, Dallas, Tex.

[21] Appl. No.: 347,021

[22] Filed: Nov. 30, 1994

[51] Int. Cl.$^6$ ............................................... G01R 31/28
[52] U.S. Cl. ........................... 324/763; 324/765; 371/22.5
[58] Field of Search ............................... 324/158.1, 765, 324/763; 371/22.5, 22.6

[56] References Cited

U.S. PATENT DOCUMENTS

| | | | |
|---|---|---|---|
| 4,550,289 | 10/1985 | Kabashima et al. | 324/763 |
| 4,687,989 | 8/1987 | Davis et al. | 324/763 |
| 4,701,921 | 10/1987 | Powell et al. | 371/22.3 |
| 4,710,931 | 12/1987 | Bellay et al. | 371/22.3 |
| 4,744,061 | 5/1988 | Takemae et al. | 365/201 |
| 4,970,454 | 11/1990 | Stambaugh et al. | 324/765 |
| 5,008,727 | 4/1991 | Katsura et al. | 371/22.6 |
| 5,051,996 | 9/1991 | Bergson et al. | 371/22.4 |
| 5,061,049 | 10/1991 | Hornbeck | 359/224 |
| 5,079,544 | 1/1992 | DeMond et al. | 340/701 |
| 5,105,369 | 4/1992 | Nelson | 364/525 |
| 5,107,208 | 4/1992 | Lee | 371/22.5 |
| 5,187,712 | 2/1993 | Malleo-Roach et al. | 371/22.1 |
| 5,357,193 | 10/1994 | Tanaka et al. | 324/158.1 |
| 5,391,501 | 2/1995 | Usami et al. | 437/7 |

*Primary Examiner*—Ernest F. Karlsen
*Attorney, Agent, or Firm*—Robert C. Klinger; James C. Kesterson; Richard L. Donaldson

[57] ABSTRACT

A large integrated circuit (10) of modular design, each module (12,14,16) having a circuit section (22,24,34) and a separate dedicated testing pad section (20). Each circuit module (12,14,16) can be individually functionally tested as an independent circuit with conventional prober equipment for defects. Each testing pad section (20) facilitates controlling the entire integrated circuit (10) so that the respective module circuit section (12,14,16) can be tested. Control circuitry (26) comprised of pass gates is provided to isolate the testing pad sections (20) from the operational portion (22,24,34) of the integrated circuit (10) when not under test. The present invention is ideally suited for large spatial light modulators, memory devices and other large sophisticated integrated circuits.

10 Claims, 2 Drawing Sheets

LARGE INTEGRATED CIRCUIT WITH MODULAR PROBE STRUCTURES

CROSS REFERENCE TO A RELATED APPLICATION

Cross referenced is made to co-pending patent application Ser. No. 07/990,992, entitled "Large Die Photolithography", filed Dec. 16, 1992.

FIELD OF THE INVENTION

The present invention is generally related to the fabrication and design of large integrated circuits, and more particularly, to the design and testing of large integrated circuits having a die which is too impractical to test with commercially available automated die probers.

BACKGROUND OF THE INVENTION

Since the invention of the integrated circuit, semiconductor dies have become increasingly more sophisticated and large in size. To ensure providing high quality and reliable products to industry, semiconductor manufactururers traditionally functionally test and optically inspect their integrated circuits before the die is packaged.

Traditionally, to perform functional die testing, off-the-shelf planar probe equipment is implemented to test the functionality of the die. The integrated circuit is usually designed with peripheral testing pads connected to the circuitry and which are accessed by the automated probers. Power is provided to the integrated circuit via the bond pads, and the circuit is dynamically tested for functionality using custom software testing programs. Integrated circuit dies which fail to meet established performance parameters are either identified and repaired, or rejected and never make it to the packaging step. This testing procedure can be rather involved, and may include subjecting the integrated circuit die to vibration, humidity, extreme temperatures, and so forth.

With the advance of the integrated circuit, off-the-shelf automated probers have advanced as well. Automated probers are available from well known companies including Hewlett Packard and Teledyne. Some sophisticated integrated circuits, including digital signal processors, microprocessors, and so forth are known to have die sizes approaching 1" by 1" which is huge by industry standards. As the size of these integrated circuits increasingly become larger, so must the sophistication and conformity of conventional testing equipment.

One interesting technology evolving from Texas Instruments Incorporated of Dallas Tex. is a Spatial Light Modulator (SLM) comprised of a Digital Micromirror Device (DMD). These DMDs can be implemented in both hard copy electrostatic printers, and also used to provide high resolution displays including monitors and large screen televisions. DMDs implemented in the design of a television is disclosed is U.S. Pat. No. 5,079,544, to DeMond et al. entitled Standard Independent Digitized Video System and U.S. Pat. No. 5,061,049 to Hornbeck, entitled Spatial Light Modulator and Method, both assigned to the assignee of the present invention. A DMD incorporated into a hard copy printing device is disclosed in U.S. Pat. No. 5,105,369, to Nelson, entitled Printing System Exposive Module Alignment Method and Apparatus of Manufacture, also assigned to the assignee of the present invention. The teachings of all three of these patents is included herein by reference in the present application.

The development of DMDs for the hard copy printing products is especially challenging due to the fact that the integrated circuits are approaching 5" in length. These DMDs comprise a linear array of micromirrors serving as pixels, and may comprise an array of 64 by 7,056 pixels. One invention which addresses the need to reliably manufacture large integrated circuits of this magnitude is disclosed in the cross referenced patent application, wherein a single reticle is implemented in a step and repeat procedure using conventional photolithography equipment. By implementing a single reticle, the step and repeat procedure exposes the die one module at a time, wherein some intermediate modules are repeated, to reliably align one module with an adjacent module. With this design technique available to fabricate large integrated circuits of enormous sizes, the forgoing invention sets out to provide the testability of an integrated circuit this size and sophistication.

SUMMARY OF THE INVENTION

The present invention finds technical advantages by providing a large integrated circuit comprised of several interconnected circuit modules each with a dedicated testing pad structure. The modular integrated circuit is such that it can be tested one module at a time by a conventional prober, with each module tested as an independent integrated circuit. The probe pads provided for testing the associated circuit of the module are consistently arranged and located module-to-module such that they can be accessed by the automated prober which steps from module to module.

In an elongated die such as that used in a hard copy DMD device, each module comprising the elongated integrated circuit has testing pads which can be used to test the circuitry on that associated module. To independently test each circuit module, full control of the entire integrated circuit is sometimes necessary from the associated testing pads on a module under test. Therefore, the testing pads can also be used to control testing of the entire integrated circuit, including circuitry of other modules comprising that integrated circuit. Some circuit modules are also provided with controllable gate circuits to allow selective access by other modules. When the testing step is not implemented, such as during normal operation of the integrated circuit, these testing pads are functionally and electrically isolated by the gate circuits from the rest of the integrated circuit so as not to interfere with normal operation of the circuit. Thus, RC problems are avoided during normal operation of the circuit.

To permit testing large integrated circuits, such as the 5" DMD die used in the hard copy device, access by one module to control circuitry on other modules is necessary to functionally exercise circuitry on a module under test. This particular die has a series of identical and repeatable modules, comprising a pixel array, arranged adjacent one another with a logic module provided at each end of the die, this left and right logic module controlling the operation of the entire die. Each of the intermediate repeatable circuit modules comprise an array of micro mirrors controlled by the logic circuitry at each end of the die. Each end logic module may also comprise a portion of the array. With the present invention, each circuit module can be tested, individually, even though it may require providing signals to adjacent modules.

According to the present invention, large non-standard integrated circuits can be fabricated, yet tested with available off the shelf testing equipment. By providing each circuit module comprising the integrated circuit with dedicated testing pads, some pads permitting control of the entire integrated circuit, failure analysis is both possible and practical. Moreover, since the testing pads can later be electrically isolated from the rest of the functional circuitry, these testing pads do not degrade the performance of the integrated circuit during normal operation.

DETAILED DESCRIPTION OF THE PREFERRED EMBODIMENT

By way of illustration, but with no limitation intended to the embodiment illustrated, the present invention will be set forth as implemented in a DMD die used in a hard copy device manufactured by Texas Instruments Incorporated of Dallas Tex. This hard copy device implements a DMD type SLM comprising a modular integrated circuit of approximately 5" in length. The DMD hard copy product is set forth in U.S. Pat. No. 5,105,369 to Nelson, entitled Printing System Exposure Module Alignment Method and Apparatus, this patent being assigned to the assignee of the present invention, and the teachings incorporated herein by reference. While the present invention is set forth as ideally suited for such a hard copy DMD device, the scope of the present invention is intended to cover all large integrated circuits of modular design, wherein each module can be tested individually with conventional testing equipment, even though the functional testing of some or all modules may depend on the cooperation of other modules.

Figure 1:
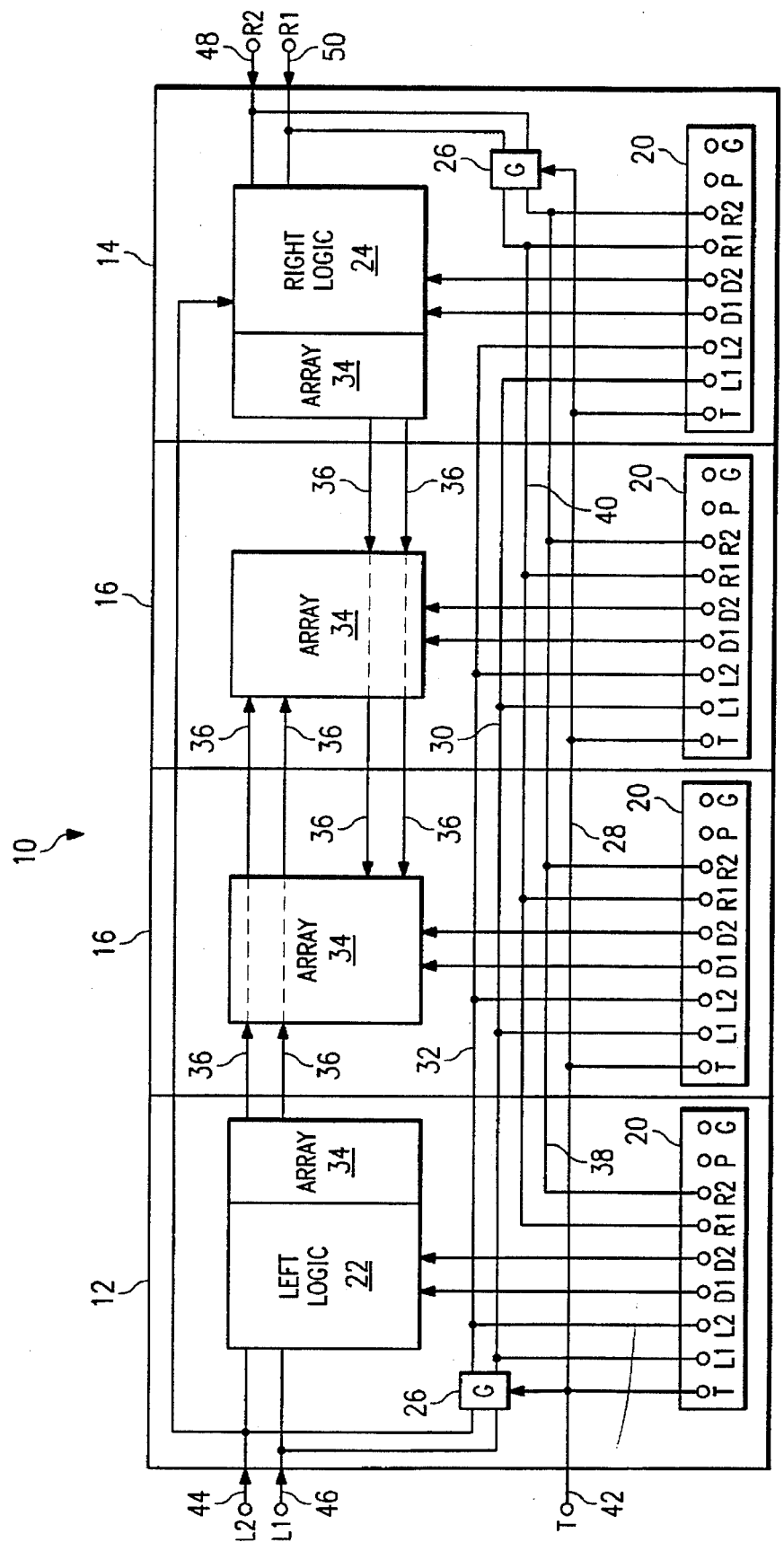
FIG. 1 is a block diagram of one large integrated circuit for which the present invention finds use, shown as a 5" long integrated circuit of modular design used in a hard copy device.

Now, with reference to FIG. 1, a simplified block diagram of an elongated integrated circuit for use in the hard copy product is shown. The integrated circuit is generally shown at 10 and is seen to comprise a left control circuit module 12, a right control circuit module 14, and a plurality of identical intermediate circuit modules 16. These modules are shown to be interconnected and arranged adjacent to one another and forming a linear array of pixels which may be of the size of 64 by 7,056 pixels. Each of circuit modules 12 and 14 may also have pixels, as shown, which form a portion of the overall pixel array. This elongated integrated circuit 10 may be fabricated using the unique process disclosed in co-pending patent application Ser. No. 07/990,992 entitled "Large Die Photolithography", filed Dec. 16, 1992, assigned to the assignee of the present invention, and the teachings of which are included herein by reference. Basically, the elongated 5" die is fabricated using a single reticle to step and repeat across a wafer using conventional photolithography techniques. Since each of the intermediate circuit modules 16 forming the mirror array are identical with one another, only three patterns are required of this reticle to expose and fabricate the large elongated integrated circuit as shown in FIG. 1. Each of circuit modules 12, 14 and 16 are shown to electrically interface on at least one side with an adjacent circuit module via connections which are precisionally achieved using this novel step and repeat process.

According to the present invention, each of circuit modules 12, 14 and 16 are also each seen to include a group of testing pads generally shown at 20. Each of these testing pads is electrically connected to one etch of the associated circuitry on that particular module. Using conventional prober equipment, the associated circuitry on each module may be functionally exercised, while being subjected to conditions including vibration, humidity and extreme temperatures if desired. The testing pads sections 20 of each module are provided in identical locations relative to the module such that standard prober equipment (not shown) can be easily stepped across the circuit 10 from one module to the next during the testing procedure. The pads for each section 20 are identically laid out, and are preferably commonly identified from module to module, as shown. For instance, the left most pad may be identified as the "T" pad of each testing pad section 20. The second, third etc. testing pad, as viewed left to right, would also be identically labeled for each testing pad as 20 section as shown. However, each of these testing pads could be used and identified differently from module to module if desired, depending on the circuitry and requirements of the associated module or the overall circuit 10.

With reference to the left and right most circuit module 12 and 14, respectively, a left logic circuit section 22 and a right logic circuit 24 can be seen to each be electrically coupled to respective testing pads D1 and D2. A gate or switching circuit 26 is seen to also be provided on each circuit module 12 and 14. The left gate circuit 26 of module 12 permits pads L1 and L2 of all modules to be selectively electrically connected to left logic circuit 22, and the right gate circuit 26 of module 14 permits all pads R1 and R2 to be selectively electrically connected to right logic circuit 24. Each testing pad "T" is seen to be connected to these gate circuits 26 via line 28, and are used to selectively enable these gate sections 26. When circuits 26 are enabled, all testing pads L1 and L2 will then become electrically connected to logic circuit 22 via lines 30 and 32, and all testing pads R1 and R2 will become electrically connected to logic circuit 24 via lines 38 and 40 for functional testing thereof if desired to utilize logic circuitry 22 and 24.

Each of intermediate circuit modules 16 can be seen to have array of pixels represented at 34, such as deflectable micro mirrors which are normally addressed and controlled by the logic circuitry 22 of module 12, as well as the logic circuit 24 provided on the right circuit module 14. The control of this array is via lines 36, as shown, which represent row and column address lines, clock lines, read and write lines, etc.

In the foregoing illustration, operation of the pixel array sections 34 is controlled by both logic circuit 22 and 24 of left and right circuit modules 12 and 14, respectively. Thus, to properly test each pixel array section 34 of circuit modules 16, circuit etches 30, 32, 38, and 40 are provided to selectively connect each of testing pads L1, L2, R1 and R2 to the appropriate logic circuits 22 and 24, via the respective gating circuitry 26, as shown. A conventional prober (not shown) can access each testing pad section 20 in a well known manner, and functionally exercise respective array 34. Power and ground is provided to integrated circuit 10 via any of testing pads P and G.

Figure 2:
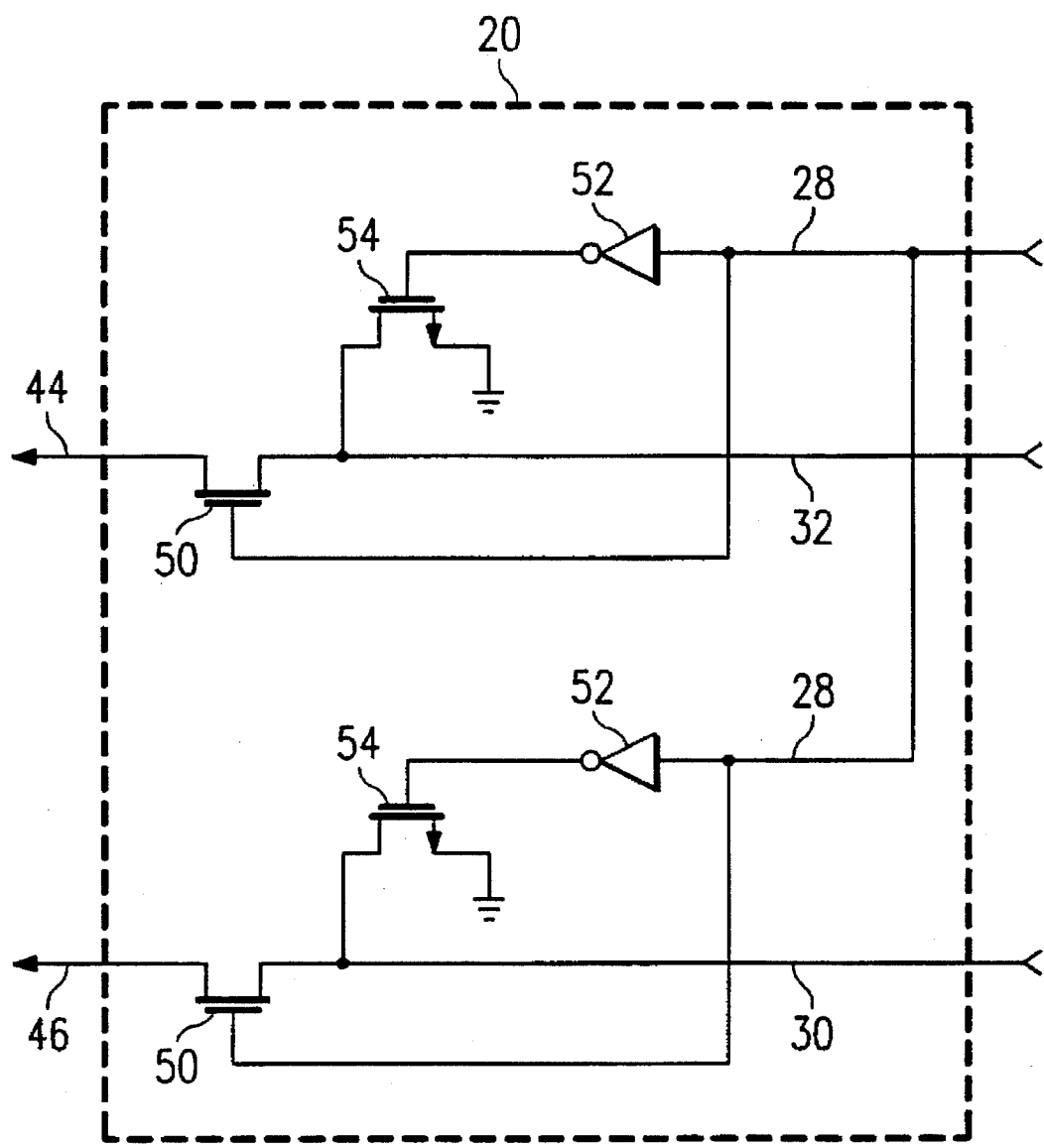
FIG. 2 is a schematic diagram of test isolation circuitry provided on some modules of FIG. 1 to selectively isolate some of the testing pads from the remaining functional circuitry during normal operation of the integrated circuit.

Referring to FIG. 2, a schematic representation of the preferred embodiment of each gate circuitry 26 is shown, although other equivalent circuits are acceptable to achieve the function, whereby the circuit 26 of module 12 is shown for purposes of illustration. Gate circuitry 26 comprises a separate MOS transistor switching device 50 in series with each associated signal line, such as lines 30, 32, 38 and 40 as shown in FIG. 1. Each MOS transistor 50 has its drain terminal connected to the input side, and its source terminal connected to the output side. The gate terminal of each MOS transistor 50 is connected the test enable line 28, this test enable line being connected to pad "T" of each pad section 20 of FIG. 1. By enabling test line 28, each switching transistor 50 will be caused to conduct allowing respective signals to pass therethrough from the drain terminal to the source terminal.

When testing of the integrated circuit 10 is not desired, testing line 28 is grounded on line 42 by a system controller (not shown), thereby causing transistors 50 to turn off and disconnect the input line from the respective output line. Therefore, during normal operation of integrated circuit 10, the testing pads 20 can be disconnected from the outside lines connecting the system controller to logic circuits 22 and 34, shown at 44, 46, 48 and 50, thereby avoiding any RC problems. As shown, the test enable line 28 is inverted by a pair of inverters 52. The output of each inverter 52 is connected to the gate terminal of a respective MOS transistor 54. Grounding pad "T" turns MOS transistors 54 on. Each transistor 54 has its drain terminal grounded, and its source terminal connected to the respective input line 30 or 32. Therefore, when the testing function is disabled by grounding line 28, transistors 54 in turn ground the input lines 30 and 32 to avoid floating.

Testing Operation

With the forgoing description of the preferred embodiment of the present invention set forth, a typical testing scenario according to the present invention will now be described. After integrated 10 has been fabricated, using techniques such as those described in the cross referenced co-pending patent application, each integrated circuit module 12, 14 and 16 will be individually tested using a conventional off the shelf testing prober (not shown), such as one of those manufactured by the Hewlett Packard Corporation, and Teledyne Corporation.

The prober equipment is coupled to the appropriate pads of pad section 20 of circuit module 12, and power and ground is applied to the P and G pads of respective section 20. Next, an enable signal, such as +5 volts, is applied to test enable pad "T", thereby enabling each of gate sections 26 on circuit modules 12 and 14. Thereafter, testing signals are applied to testing pads L1, L2, D1, D2, R1 and R2 to appropriately test and exercise the associated circuitry 22. After circuit module 12 has been tested using a software routine which may be custom designed for this associated circuit module 12, the prober equipment is stepped right to the next circuit module 16 to be tested, and connected to the testing pad section 20 with associated module circuitry 34.

Again, power and ground is applied to pad P and G to power and enable operation of the entire integrated circuit 10. Test enable pad T is biased, and appropriate testing signals are provided to the testing pads 20 to functionally exercise the respective array circuitry 34 of the associated circuit module 16. While some testing signals are unswitched and provided directly to array 34 via respective testing pads D1 and D2 such as clock signals, other testing circuit signals needed to operate array 34 such as row and column address bits, write and read bits, etc., are provided to the left and right logic circuitry 22 and 24 of circuit 12 and 14. These testing signals are provided thereto via lines 30, 32, 38 and 40 and the respective gating circuitry 26. Of course, this gating circuitry 26 has first been enabled by applying the appropriate bias to test enable pad T. Logic circuits 22 and 24 process these signals from pads L1, L2 R1 and R2, and provide output signals on lines 36 to array 34 which are necessary to exercise array 34. The testing program implemented emulates the system controller (not shown) normally used to control the circuit 10 via lines 44, 46, 48 and 50 when implemented in the hard copy device.

Thereafter, the prober equipment is stepped right to the next circuit module 16 to be tested, and the same testing sequence again preformed. Finally, the probing equipment will be stepped right to the last circuit module 14 with the appropriate testing signals being provided to the respective testing pads 20.

Each of the circuit modules 12, 14 and 16 can be individually tested and exercised, dynamically, using conventional off-the-shelf prober testing equipment. The arrangement of the testing pads on each circuit module, and in cooperation with the gating circuitry 26 of the left logic circuit 22 and the right logic circuitry 24, allows complete operation of integrated circuit 10 from any of the testing pads 20 of any of circuit modules 12, 14 or 16. Each of the circuit modules can be characterized, with any defects being isolated at the module level.

Other Embodiments

While the present invention has been set forth with reference to an elongated DMD integrated circuit such as those implemented in a hard copy device, the scope of the present invention is intended to cover the modular design and method of testing all integrated circuits of non-standard size, and of size greater than that compatible with conventional off-the-shelf prober equipment. Thus, a large integrated circuit having both a large width and length, such as large memory devices, signal processors, microprocessors etc., are also within the scope of the present invention. The integrated circuit is modularized and provided with dedicated testing pads, with each module being individually testable. Some modules are tested with the cooperation of other modules comprising that large integrated circuit. Therefore, the present invention is flexible and can be incorporated into any integrated circuit architecture which can be modularized, such as into arrays or functional subsets.

While the present invention has been set forth where the testing pads sections are set forth in identical locations from module to module, limitation to identically arranging these testing pad sections is not being inferred. For instance, the testing pads sections can be provided into a lower left corner of one module, a middle location of the next circuit module, and a lower right location of the next circuit module. Testing of each module can still be done individually using conventional prober equipment, whereby these testing pad sections may provide access to control the entire integrated circuit. Some or all of these testing pads can be electrically disconnected from the integrated circuit during normal operation, such as by disabling the gating circuit which connects the testing pads to the circuit module circuit sections. With the present invention, each of the circuit modules can be optically tested as well using conventional technology and equipment.

While the present invention has been set forth as including only a few testing pads for each pad section, and only a few interconnected and dedicated signal lines, it is to be understood that many testing pads, and many such signal lines are typical in such complex devices, and are suitable with the present invention. In addition, the gate circuitry 26 can be implemented using other circuit designs to selectively isolate the testing pads from the operational circuit.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A semiconductor integrated circuit comprised of a plurality of interconnected circuit modules, each said module having a circuit section and a dedicated testing pad section coupled to said circuit section, said integrated circuit having a control circuit connected to both a first said testing pad section of a first said module and to said circuit section of a second said module, said control circuit facilitating operation of said second module circuit section to test said first module circuit section from said first testing pad section.

2. The integrated circuit as specified in claim 1 wherein one said testing pad section is identical to at least one other said module testing pad section to permit testing of said circuit modules with a single piece of testing equipment.

3. The integrated circuit as specified in claim 1 wherein at least two said circuit modules have commonly located said testing pad sections relative to said circuit modules.

4. The integrated circuit as specified in claim 1 wherein said control circuit selectively electrically isolates said first testing pad section of said first module from said circuit section of said second circuit module.

5. The integrated circuit as specified in claim 1 wherein at least two said circuit modules are not identical to each other.

6. The integrated circuit as specified in claim 1 wherein at least two said circuit modules are identical to one another.

7. The integrated circuit as specified in claim 6 wherein said two identical circuit modules are coupled to a non-identical said circuit module.

8. The integrated circuit as specified in claim 1 wherein said circuit modules form an elongated said integrated circuit having a length greater than about 1 inch.

9. The integrated circuit as specified in claim 6 wherein said identical circuit modules comprise a spatial light modulator.

10. The integrated circuit as specified in claim 9 wherein said spatial light modulator is comprised of a plurality of micro mirrors.

* * * * *